(12) United States Patent
Strassburg et al.

(10) Patent No.: US 8,581,264 B2
(45) Date of Patent: Nov. 12, 2013

(54) SEMICONDUCTOR BODY AND METHOD OF PRODUCING A SEMICONDUCTOR BODY (75) Inventors: Martin Strassburg, Tegernheim (DE); Hans-Juergen Lugauer, Sinzing (DE); Vincent Grolier, Munich (DE); Berthold Hahn, Hemau (DE); Richard Floeter, Tegernheim (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 243 days.

(21) Appl. No.: 12/922,864

(22) PCT Filed: May 28, 2009

(86) PCT No.: PCT/DE2009/000756
§ 371 (c)(1),
(2), (4) Date: Dec. 10, 2010

(87) PCT Pub. No.: WO2009/149687
PCT Pub. Date: Dec. 17, 2009

(65) Prior Publication Data
US 2011/0073902 A1    Mar. 31, 2011

(30) Foreign Application Priority Data
Jun. 13, 2008 (DE) .......................... 10 2008 028 345

(51) Int. Cl.
*H01L 27/15* (2006.01)
*H01L 29/26* (2006.01)
*H01L 31/12* (2006.01)
*H01L 33/00* (2010.01)

(52) U.S. Cl.
USPC ........................ 257/79; 438/45; 257/E33.001

(58) Field of Classification Search
USPC ............. 257/9–14, 21, 22, 79, 431, 290–294, 257/E33.001–E33.017, E33.022, 257/E33.025–E33.036, E33.044–E33.045; 438/45–47, 510–567
See application file for complete search history.

(56) References Cited

U.S. PATENT DOCUMENTS

| | | |
|---|---|---|
| 7,041,519 B2 | 5/2006 | Taki |
| 2002/0157596 A1 | 10/2002 | Stockman et al. |
| 2002/0187568 A1 | 12/2002 | Stockman |
| 2004/0058465 A1 | 3/2004 | Taki |
| 2004/0104399 A1 | 6/2004 | Ou et al. |
| 2005/0230701 A1* | 10/2005 | Huang .......................... 257/103 |
| 2006/0097269 A1 | 5/2006 | Lester |
| 2006/0197104 A1 | 9/2006 | Tamura et al. |
| 2006/0267033 A1 | 11/2006 | Koide et al. |

(Continued)

FOREIGN PATENT DOCUMENTS

| | | |
|---|---|---|
| DE | 10 2005 035 722 A1 | 2/2007 |
| DE | 10 2007 018 307 A1 | 7/2008 |

(Continued)

OTHER PUBLICATIONS

Schnitzer, I., et al., "30% External Quantum Efficiency from Surface Textured, Thin-Film Light-Emitting Diodes," Applied Physics Letters, 1993, 3 pages, vol. 63, No. 16.

*Primary Examiner* — Julio J Maldonado
*Assistant Examiner* — Sonya D McCall Shepard
(74) *Attorney, Agent, or Firm* — Slater & Matsil, L.L.P.

(57) ABSTRACT

A semiconductor body includes an n-conductive semiconductor layer and a p-conductive semiconductor layer. The p-conductive semiconductor layer contains a p-dopant and the n-conductive semiconductor layer an n-dopant and a further dopant.

19 Claims, 3 Drawing Sheets

(56) References Cited

U.S. PATENT DOCUMENTS

| | | | |
|---|---|---|---|
| 2007/0090372 A1* | 4/2007 | Wu et al. | 257/79 |
| 2008/0203407 A1 | 8/2008 | Ahlstedt et al. | |
| 2008/0308829 A1* | 12/2008 | Liu et al. | 257/98 |
| 2009/0090900 A1 | 4/2009 | Avramescu et al. | |

FOREIGN PATENT DOCUMENTS

| | | |
|---|---|---|
| DE | 10 2007 019 079 A1 | 7/2008 |
| JP | 10-242586 A | 9/1998 |
| JP | 2003-068745 A | 3/2003 |
| JP | 2004-134750 A | 4/2004 |
| JP | 2005-268739 A | 9/2005 |
| JP | 3916361 B2 | 5/2007 |
| TW | 554550 B | 9/2003 |
| TW | 200919783 A | 5/2009 |
| WO | WO 2007/012327 A1 | 2/2007 |
| WO | WO 2008/089739 A1 | 7/2008 |

\* cited by examiner

SEMICONDUCTOR BODY AND METHOD OF PRODUCING A SEMICONDUCTOR BODY

This patent application is a national phase filing under section 371 of PCT/DE2009/000756, filed May 28, 2009, which claims the priority of German patent application 10 2008 028 345.2, filed Jun. 13, 2008, each of which is incorporated herein by reference in its entirety.

TECHNICAL FIELD

The present application relates to a semiconductor body and to a method of producing a semiconductor body.

BACKGROUND

In the case of light-emitting diodes based on nitride compound semiconductors, semiconductor layers are often used which are doped with magnesium for p-conduction. During production, the semiconductor layers may be subjected to an activation step, in which hydrogen incorporated into the layer is separated from the magnesium. In particular in the case of buried semiconductor layers, insufficient activation of the magnesium may lead to an increased operating voltage of the light-emitting diode.

SUMMARY

In one aspect, the present invention provides a semiconductor body that exhibits improved optoelectronic characteristics. In particular, the p-conductive semiconductor layer is intended to exhibit an improved degree of activation. It is additionally intended to provide a method of producing a semiconductor body.

According to an embodiment, a semiconductor body comprises an n-conductive semiconductor layer and a p-conductive semiconductor layer. The p-conductive semiconductor layer contains a p-dopant. The n-conductive semiconductor layer contains an n-dopant and a further dopant.

The further dopant enables a permanent increase in the degree of activation of the p-conductive semiconductor layer, i.e., the proportion of atoms of the p-dopant which provide holes as charge carriers is increased.

In particular the n-conductive semiconductor layer comprises at least locally elevated permeability for hydrogen. The solubility of hydrogen in the n-conductive semiconductor layer may be increased by means of the further dopant. On activation of the p-conductive semiconductor layer, hydrogen may pass through the n-conductive semiconductor layer arranged over the p-conductive layer. The diffusion of hydrogen through the n-conductive semiconductor layer may also be simplified by the further dopant.

In a configuration, between the p-conductive semiconductor layer and the n-conductive semiconductor layer there is formed an active region intended for generating radiation and/or a tunnel contact. In other words a functional pn-junction is located between the p-conductive semiconductor layer and the n-conductive semiconductor layer. The functional pn-junction serves either to generate radiation (in the case of the active region) or for electrical connection of a p-doped layer with an n-doped layer (in the case of the tunnel junction). The tunnel junction may here for example comprise a highly p-doped tunnel layer and a highly n-doped tunnel layer.

In an embodiment of the semiconductor body the p-conductive semiconductor layer is covered by at least one further semiconductor layer. The further semiconductor layer may for example be a semiconductor layer with the active region provided for generating radiation or with the tunnel contact. In any event, the p-conductive semiconductor layer is then buried and not located on an outer side of the semiconductor body, i.e., the p-conductive semiconductor layer is not exposed.

In a configuration of the semiconductor body the p-conductive semiconductor layer is arranged between the active region and a carrier or a growth substrate. The n-conductive semiconductor layer with the n-dopant and the further dopant may then be arranged on the side of the active region remote from the p-conductive semiconductor layer. In any event, the p-conductive semiconductor layer is then buried and not freely accessible from outside the semiconductor body.

In a configuration of the semiconductor body the n-conductive semiconductor layer exhibits a thickness of at least 5 nm, preferably at least 10 nm, particularly preferably of at least 20 nm. Such an n-conductive semiconductor layer without further dopant, i.e., just with an n-dopant, is impermeable to hydrogen. Only by adding the further dopant is the layer made permeable to hydrogen. Advantageously, the n-conductive semiconductor layer may in the present case be thicker than 20 nm, which for example improves the transverse conductivity of the n-conductive semiconductor layer.

The semiconductor body is preferably based on a nitride compound semiconductor material.

In the present context, "based on nitride compound semiconductors" means that the active epitaxial layer sequence or at least one layer thereof comprises a nitride III-V compound semiconductor material, preferably $Al_nGa_mIn_{1-n-m}N$, wherein $0 \leq n \leq 1$, $0 \leq m \leq 1$ and $n+m \leq 1$. This material need not necessarily exhibit a mathematically exact composition according to the above formula. Instead, it may comprise one or more dopants and additional constituents which do not substantially modify the physical characteristics of the $Al_nGa_mIn_{1-n-m}N$ material. For simplicity's sake, however, the above formula includes only the fundamental constituents of the crystal lattice (Al, Ga, In, N), even if these may in part be replaced by small quantities of further substances.

In a preferred configuration, the further dopant is configured with regard to material and concentration in such a way in the n-conductive semiconductor layer as to increase permeability of the n-conductive semiconductor layer to hydrogen. On activation of the p-conductive semiconductor layer, hydrogen may pass more readily through the n-conductive semiconductor layer. The degree of activation of the p-conductive semiconductor layer may in this way be increased. The solubility of hydrogen in the n-conductive semiconductor layer may here be increased by means of the further dopant.

In a further preferred configuration, the further dopant in the n-conductive semiconductor layer acts as an acceptor.

Elements suitable as acceptors in a nitride compound semiconductor material are those from the first and second main groups of the periodic table of elements. By incorporating such an element at a lattice site of a group III element into the crystal, the p-conduction of the semiconductor material may be increased.

As a result of the further dopant acting as an acceptor, the n-doping is partially compensated by means of the further dopant. It has been found that, despite the partial compensation of the n-doping in the n-conductive semiconductor layer, the acceptor as a further dopant brings about overall an improvement in the optoelectronic characteristics of the semiconductor body due to the increased degree of activation of the p-dopant in the p-conductive semiconductor layer.

In a preferred configuration the further dopant is magnesium. Magnesium atoms introduced into the n-conductive semiconductor layer may lead to in particular locally elevated solubility of hydrogen in this semiconductor layer. Hydrogen may more readily diffuse through the n-conductive semiconductor layer and in this way arrive at an end face of the semiconductor body remote from the growth substrate and moreover preferably exit therefrom.

In a further configuration, the further dopant of the n-conductive semiconductor layer is identical to the p-dopant of the p-conductive semiconductor layer. In particular, the further dopant and the p-dopant may in each case be magnesium.

The concentration of the further dopant preferably amounts to at most 50% of the concentration of the n-dopant. At a dopant concentration of at most 50% of the further dopant relative to the n-dopant, substantial impairment of the optoelectronic characteristics of the semiconductor body as a result of excessive compensation of the n-doping may be avoided.

Furthermore, the concentration of the further dopant in the n-conductive semiconductor layer preferably amounts to at least $1 \times 10^{16}$ cm$^{-3}$. In particular the concentration may amount to between $1 \times 10^{17}$ cm$^{-3}$ inclusive and $5 \times 10^{18}$ cm$^{-3}$ inclusive, particularly preferably between $1 \times 10^{17}$ cm$^{-3}$ inclusive and $2 \times 10^{18}$ cm$^{-3}$ inclusive. In this way, the permeability of the n-conductive semiconductor layer to hydrogen may be increased, without significant impairment of the optical quality of the n-conductive semiconductor layer occurring.

The semiconductor body preferably comprises an active region intended for generating radiation. The active region may in particular be provided between the p-conductive semiconductor layer and the n-conductive semiconductor layer.

In a preferred further development, the semiconductor body comprises a further active region, wherein the active region and the further active region are in each case intended for generating radiation. By means of the further active region the total radiant power which can be generated may be increased while the base area of the semiconductor body remains the same.

In particular, the n-conductive semiconductor layer may be provided between the active region and the further active region. The activatability of the p-conductive semiconductor layer covered by the n-conductive semiconductor layer on production of the semiconductor body is improved.

A semiconductor chip may be formed by means of the semiconductor body. The semiconductor chip may be embodied for example as a luminescent diode chip or as a laser diode chip.

In a preferred configuration, a growth substrate for the semiconductor body is removed completely or at least in places. Such a semiconductor chip is also known as a thin film semiconductor chip.

A thin-film semiconductor chip, for instance a thin-film light-emitting diode chip, may furthermore be distinguished for the purposes of the present application by at least one of the following characteristic features:

on a first major surface, facing the carrier element, of a semiconductor body comprising a semiconductor layer sequence with an active region, in particular of an epitaxial layer sequence, a mirror layer is applied or formed, for instance integrated as a Bragg mirror in the semiconductor layer, said mirror layer reflecting back into the semiconductor layer sequence at least some of the radiation generated in said sequence;

the semiconductor layer sequence has a thickness in the range of 20 μm or less, in particular in the range of 10 μm; and/or the semiconductor layer sequence contains at least one semiconductor layer with at least one face which comprises an intermixing structure, which ideally leads to an approximately ergodic distribution of the light in the semiconductor layer sequence, i.e., it exhibits scattering behavior which is as ergodically stochastic as possible.

The basic principle of a thin-film light-emitting diode chip is described for example in I. Schnitzer et al., Appl. Phys. Lett. 63 (16), 18 Oct. 1993, 2174-2176, the disclosure content of which in this respect is hereby included by reference in the present application.

In a method of producing a semiconductor body with an n-conductive semiconductor layer and a p-conductive semiconductor layer, according to one embodiment a semiconductor layer is deposited which contains a p-dopant and hydrogen. An n-conductive semiconductor layer is deposited, preferably on the p-conductive semiconductor layer, wherein the n-conductive semiconductor layer contains an n-dopant and a further dopant. To form the p-conductive semiconductor layer the p-dopant of the semiconductor layer is activated, hydrogen from the semiconductor layer passing through the n-conductive semiconductor layer.

A method of producing a semiconductor chip with an elevated degree of activation of the p-conductive semiconductor layer is in this way simply obtained.

Activation preferably proceeds thermally. By heating the semiconductor body, the hydrogen may be simply expelled from the semiconductor body.

The n-conductive semiconductor layer may be deposited on the semiconductor layer, wherein the n-conductive semiconductor layer may completely cover the semiconductor layer. Due to the improved permeability of the n-conductive semiconductor layer to hydrogen, an in particular completely buried p-conductive semiconductor layer may thus also be highly efficiently activated. Semiconductor bodies may thus more readily be deposited in which the p-conductive semiconductor layer is deposited prior to the active region and prior to the n-conductive semiconductor layer. In this case the p-conductive semiconductor layer is thus closer to the growth substrate than the n-conductive semiconductor layer.

In a configuration of the semiconductor body, the semiconductor body comprises a polarization-inverted structure with the following layer sequence. The semiconductor body comprises a growth substrate, on which is arranged the p-conductive semiconductor layer. The active region is arranged on the side of the p-conductive semiconductor layer remote from the growth substrate. On the side of the p-conductive semiconductor layer remote from the active region there is arranged the n-conductive semiconductor layer with an n-dopant and a further dopant. Such a "polarity-inverted" structure is described for example in publication WO 2007/012327 and U.S. counterpart publication 2009/0090900, the disclosure content of which is hereby included by reference.

With a polarity-inverted structure too, the p-conductive semiconductor layer is buried, i.e. it is covered by further semiconductor layers. On activation of the p-conductive semiconductor layer, hydrogen has thus to pass through the further semiconductor layers, in particular through the n-conductive semiconductor layer, so as to be able to leave the semiconductor body. This is here possible as a result of co-doping the n-conductive semiconductor layer with a further dopant, for example the p-dopant, which is also used in the p-conductive semiconductor layer.

In the case in particular of a semiconductor body based on nitride semiconductor material, a sequence of layers, in which first of all the n-conductive semiconductor layer and then the active region and the p-conductive semiconductor layer are deposited, may result in piezoelectric fields making the injection of charge carriers into the active region more difficult. As a result of this, semiconductor chips with such semiconductor bodies exhibit an internal quantum efficiency which falls sharply with the density of the current impressed into the semiconductor chip.

On the other hand, a sequence in which first the p-conductive semiconductor layer and then the active region and the n-conductive semiconductor layer are deposited may exploit the polarity of the piezoelectric fields in order to assist in the trapping of charge carriers in the active region. With this sequence of the multilayer structure, the piezoelectric fields thus contribute to improved trapping of charge carriers in the active region. Internal quantum efficiency thereby becomes virtually independent of current density.

If in particular the buried p-conductive semiconductor layer is doped with magnesium, activation thereof may be improved due to the improved hydrogen permeability of the n-conductive semiconductor layer located thereover.

The above-described method is particularly suitable for producing a semiconductor body described further above. Features listed in connection with the semiconductor body may therefore also be used for the method and vice versa.

BRIEF DESCRIPTION OF THE DRAWINGS

Further features, advantageous configurations and convenient aspects are revealed by the following description of the exemplary embodiments in conjunction with the Figures, in which.

Identical, similar or identically acting elements are provided with identical reference numerals in the Figures.

The figures are in each case schematic representations and are therefore not necessarily true to scale. Rather, comparatively small elements and in particular layer thicknesses may be illustrated on an exaggeratedly large scale for clarification.

DETAILED DESCRIPTION OF ILLUSTRATIVE EMBODIMENTS

Figure 1:
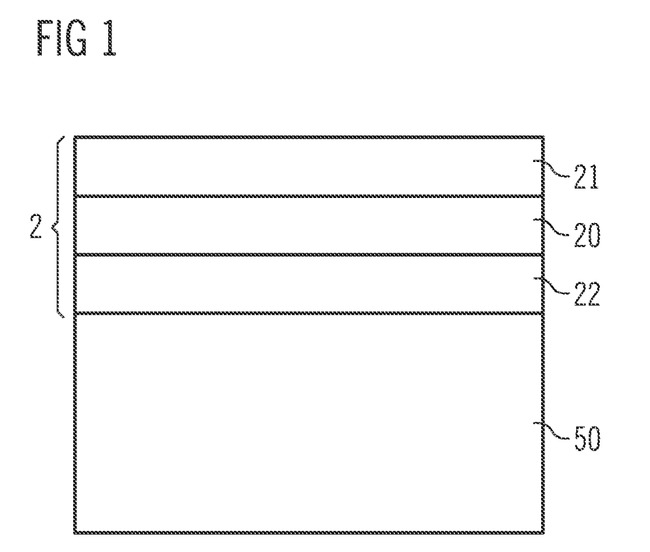
FIG. 1 is a schematic sectional view of a first exemplary embodiment of a semiconductor body.

A first exemplary embodiment of a semiconductor body is illustrated schematically in sectional view in FIG. 1. The semiconductor body 2 comprises an n-conductive semiconductor layer 21 and a p-conductive semiconductor layer 22. Between the n-conductive semiconductor layer and the p-conductive semiconductor layer an active region 20 is provided, which is intended for generating radiation.

The layer sequence as described in relation to FIG. 1 comprises for example a polarity-inverted structure, as described further above, i.e., the following sequence is obtained in the growth direction: p-conductive layer 22, active region 20, n-conductive layer 21. The growth direction is here preferably parallel to the crystallographic c-axis of the semiconductor body.

This layer sequence makes use of the polarity of the piezoelectric fields which form in the semiconductor body 10 to assist in the trapping of charge carriers in the active region 20. In this sequence, the piezoelectric fields thus contribute to improved trapping of charge carriers in the active region 20. The internal quantum efficiency for example of multiple quantum wells in the active region 20 thereby becomes virtually independent of current density.

The semiconductor layers of the semiconductor body 2 are preferably deposited epitaxially, for instance by means of MOVPE or MBE, on a growth substrate 50.

The semiconductor body 2 is based on a nitride compound semiconductor material and may be provided for example for generating ultraviolet, blue or green radiation.

Sapphire, silicon carbide, gallium nitride, silicon, a transparent oxide, for instance ZnO, or glass are suitable as the growth substrate 50.

The p-conductive semiconductor layer 22 contains magnesium as p-dopant. The n-conductive semiconductor layer 21 contains an n-dopant, for example silicon.

Furthermore, the n-conductive semiconductor layer 21 contains a further dopant. In particular, magnesium is especially suitable as a further dopant for the n-conductive semiconductor layer. The permeability of the n-conductive semiconductor layer 21 to hydrogen is increased by means of the further dopant. The further dopant may thus correspond to the p-dopant of the p-conductive semiconductor layer.

The hydrogen incorporated into the semiconductor layer 220 (see FIG. 4a) may thus pass more readily through the n-conductive semiconductor layer 21 and escape from the semiconductor body 2. In this way, the degree of activation of the p-conductive semiconductor layer 22 may be simply and reproducibly improved.

The concentration of the further dopant in the n-conductive semiconductor layer 21 amounts preferably to at least $1 \times 10^{16}$ $cm^{-3}$, particularly preferably to between $1 \times 10^{17}$ $cm^{-3}$ and $5 \times 10^{18}$ $cm^{-3}$ inclusive, most preferably $1 \times 10^{17}$ $cm^{-3}$ and $2 \times 10^{18}$ $cm^{-3}$. It is thus possible to achieve good permeability to hydrogen at the same time as good optical quality of the n-conductive semiconductor layer.

The concentration of the further dopant preferably amounts to at most 50% relative to the concentration of the n-dopant. Excessive compensation of the n-dopant by the further dopant may thus be avoided.

The p-conductive semiconductor layer 22 is arranged between the growth substrate 50 and the n-conductive semiconductor layer 21. The n-conductive semiconductor layer 21 covers the p-conductive semiconductor layer 22 on the side remote from the growth substrate 50. The p-conductive semiconductor layer is thus implemented as a buried semiconductor layer that has been deposited prior to the active region 20 and prior to the n-conductive semiconductor layer.

As a result of this sequence of p-conductive semiconductor layer 22, active region 20 and n-conductive semiconductor layer 21, the semiconductor body may be embodied such that charge carriers are more readily injected into the region and furthermore the piezoelectric fields occurring may promote the recombination of charge carriers in the active region. Furthermore, the p-conductive semiconductor layer may comprise an elevated degree of activation, such that a semiconductor chip with such a semiconductor body may exhibit improved optoelectronic characteristics.

Figure 2:
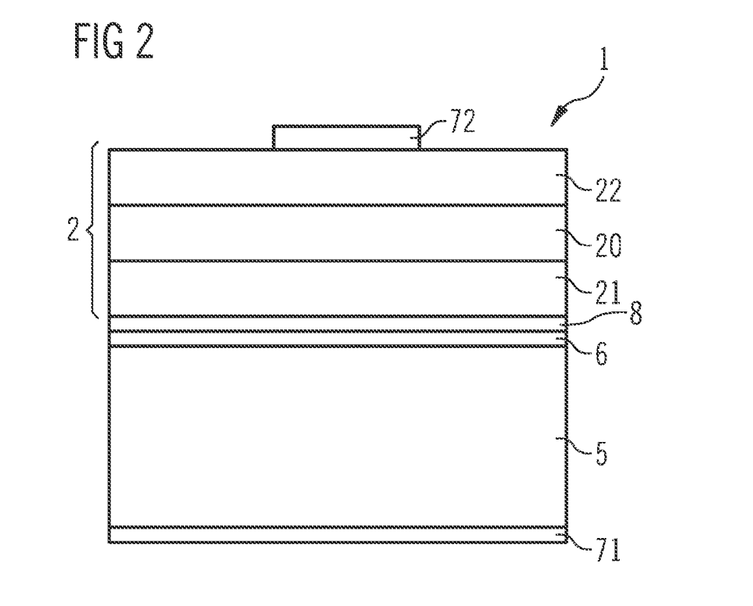
FIG. 2 is a schematic sectional view of a first exemplary embodiment of a semiconductor chip with a semiconductor body.

An exemplary embodiment of a semiconductor body is illustrated schematically in sectional view in FIG. 2. The semiconductor chip 1 comprises a semiconductor body 2. The semiconductor body may be constructed in particular as described in relation to FIG. 1.

The semiconductor body 2 is arranged on a carrier 5 which differs from the growth substrate for the semiconductor layer sequence of the semiconductor body 2. The semiconductor body 2 is connected mechanically stably to the carrier 5 by means of a bonding layer 6. The bonding layer 6 may for example be a solder layer or an electrically conductive adhesive layer.

Furthermore, the semiconductor chip 1 comprises a first contact 71 and a second contact 72. The contacts are intended for external electrical contacting of the semiconductor chip 1 and are arranged in such a way that, when the semiconductor chip is in operation, charge carriers may be injected into the active region 20 from different sides and there recombine with the emission of radiation.

A current spreading layer (not shown explicitly in the figure) may be provided between the p-conductive semiconductor layer 22 and the second contact 72. This makes it more straightforwardly possible to impress current uniformly in the lateral direction via the p-conductive semiconductor layer into the active region 20.

The current spreading layer conveniently extends in the lateral direction beyond the second contact 72. The current spreading layer preferably covers the p-conductive semiconductor layer 22 completely or substantially completely.

The current spreading layer may be embodied as a further n-conductive semiconductor layer and furthermore preferably exhibit greater transverse conductivity than the p-conductive semiconductor layer. The further n-conductive semiconductor layer is preferably constructed in such a way that a tunnel junction is formed between this further n-conductive semiconductor layer and the p-conductive semiconductor layer 22, via which tunnel junction the charge carriers may pass from the second contact 72 into the p-conductive semiconductor layer when the semiconductor chip is in operation.

Alternatively, the current spreading layer may be arranged outside the semiconductor body 2. Such a current spreading layer may be applied to the prefabricated semiconductor body for example by means of vapor deposition or sputtering.

In this case the current spreading layer may for example contain a TCO (transparent conductive oxide) material, for instance ITO (indium tin oxide) or ZnO, or consist of such a material.

A metallic current spreading layer, which is so thin that it is transparent or at least translucent for radiation generated in the active region, is also feasible.

It goes without saying that the current spreading layer may also be of multilayer construction and for example comprise a TCO layer and a metal layer.

A mirror layer 8 is formed between the semiconductor body 2 and the carrier 5. Radiation generated in the active region 20 when the semiconductor chip 1 is in operation and emitted in the direction of the carrier 5 may be reflected at the mirror layer 8. The risk of the radiation being absorbed in the carrier may thus be avoided.

The mirror layer 8 may, for example, contain a metal, for instance silver, aluminum, rhodium or palladium or consist of such a material.

The carrier 5 is preferably electrically conductive. For example, the carrier 5 may contain a semiconductor material, for instance germanium, gallium arsenide or silicon, or consist of such a material. On the other hand, the carrier 5 may also contain a ceramic, for instance aluminum nitride or boron nitride, or consist of such a material.

In the exemplary embodiment illustrated in FIG. 2, the semiconductor chip 1 merely by way of example takes the form of a thin-film light-emitting diode chip. In contrast to the exemplary embodiment shown, the growth substrate for the semiconductor body 2 may also remain in the semiconductor chip. For example the growth substrate may be thinned in places or all over or be removed in places.

Furthermore the contacts 71, 72 may also be arranged on the same side of the semiconductor chip, such that the semiconductor chip is externally electrically contactable from just one side.

The contacts 71, 72 are conveniently electrically conductive and additionally preferably contain a metal, for instance titanium, platinum, nickel, gold, aluminum, rhodium or palladium or a metallic alloy with at least one of the stated metals.

Figure 3:
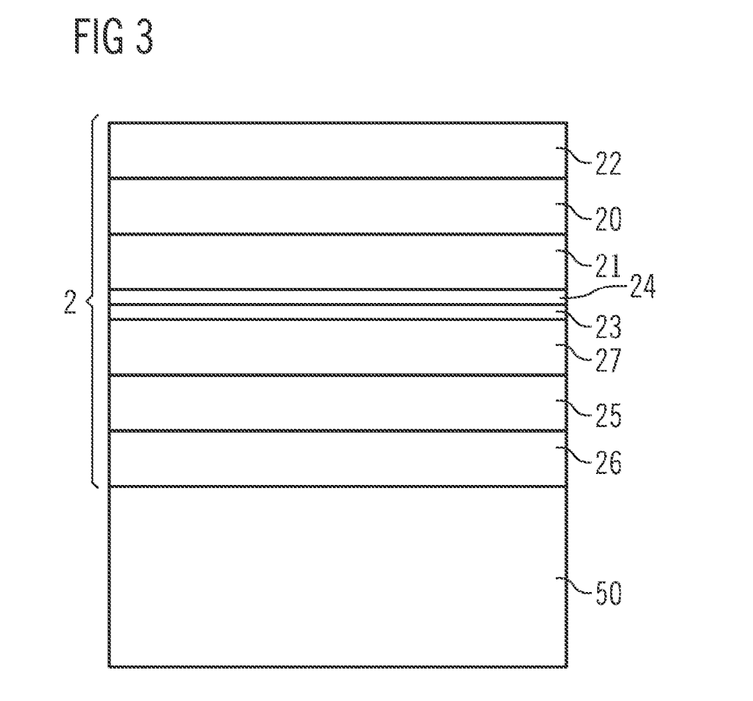
FIG. 3 is a schematic sectional view of a second exemplary embodiment of a semiconductor body.

A second exemplary embodiment of a semiconductor body is illustrated schematically in sectional view in FIG. 3. This second exemplary embodiment substantially corresponds to the first exemplary embodiment described in connection with FIG. 1.

Unlike the first exemplary embodiment, the semiconductor body 2 comprises a further active region 25, a further n-conductive semiconductor layer 26 and a further p-conductive semiconductor layer 27. Between the active region 20 and the further active region 25 there are arranged a first tunnel layer 23 and a second tunnel layer 24. The first tunnel layer and the second tunnel layer form a tunnel contact, via which the active regions 20, 25 are interconnected electrically in series with one another. By means of the additional active region the total radiant power which can be generated in the semiconductor body may be increased. The tunnel layers 23, 24 are preferably different from one another with regard to conduction type and additionally preferably exhibit a high doping concentration, particularly preferably of at least $1 \times 10^{19}$ cm$^{-3}$.

Unlike the first exemplary embodiment described in connection with FIG. 1, the p-conductive semiconductor layer 22 is arranged on the side of the n-conductive semiconductor layer 21 remote from the growth substrate 50. In this exemplary embodiment, the n-conductive semiconductor layer 21 covers the p-conductive semiconductor layer 27 on the side remote from the growth substrate 50. The p-conductive semiconductor layer is thus deposited on the growth substrate after the n-conductive semiconductor layer 21.

The further p-conductive semiconductor layer 27 may here be configured substantially like the p-conductive semiconductor layer 22. On activation of the p-conductive semiconductor layer 22, the latter is exposed, such that hydrogen may escape unhindered from this semiconductor layer.

The further p-conductive semiconductor layer 27 is covered by the n-conductive semiconductor layer 21 on the side remote from the carrier 50. Because of the further dopant provided in the n-conductive semiconductor layer 21, this n-conductive semiconductor layer exhibits increased permeability to hydrogen, such that on activation of the further p-conductive semiconductor layer 27 hydrogen may pass through the n-conductive semiconductor layer 21.

On the other hand, no p-conductive semiconductor layer is provided between the further n-conductive semiconductor layer 26 and the growth substrate 50. In the case of the further n-conductive semiconductor layer 26, hydrogen permeability is therefore of lesser importance. The further dopant may therefore be omitted from this further n-conductive semiconductor layer.

Figure 4A:
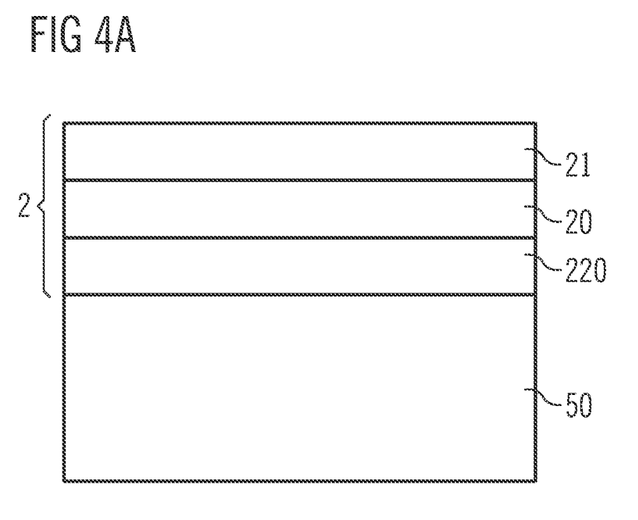
FIGS. 4A to 4B show an exemplary embodiment of a method of producing a semiconductor body, by means of intermediate steps shown in each case schematically in sectional view.
Figure 4B:
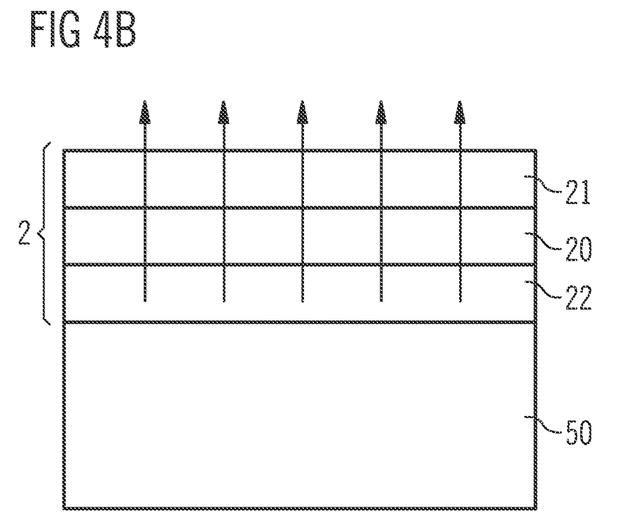

An exemplary embodiment of a method of producing a semiconductor body is illustrated schematically in FIGS. 4A and 4B by way of intermediate steps. The method is described by way of example with reference to the production of a semiconductor body which is embodied as described in connection with FIG. 1.

A semiconductor layer 220 containing a p-dopant and hydrogen is deposited on a growth substrate 50. An active region 20 and an n-conductive semiconductor layer 21 are deposited on this semiconductor layer. The semiconductor layer, the active region 20 and the n-conductive semiconductor layer 21 form the semiconductor body 2. After deposition of the semiconductor body the semiconductor layer 220 is activated. This may, for example, proceed thermally. On activation it is possible, as shown schematically by arrows in FIG. 4B, for hydrogen to diffuse out of the semiconductor layer through the active region and the n-conductive semiconductor layer 21. The hydrogen may thus be expelled from the semiconductor body 2 on the side remote from the growth substrate.

The invention is not restricted by the description given with reference to the exemplary embodiments. Rather, the invention encompasses any novel feature and any combination of features, including in particular any combination of features in the claims, even if this feature or this combination is not itself explicitly indicated in the claims or the exemplary embodiments.

The invention claimed is:

1. A semiconductor body comprising:
   an n-conductive semiconductor layer, wherein the n-conductive semiconductor layer contains an n-dopant and a further dopant, wherein the further dopant has a concentration of at least $10^{16}$ cm$^{-3}$;
   a p-conductive semiconductor layer, wherein the p-conductive semiconductor layer contains a p-dopant; and
   an active region and/or a tunnel contact between the p-conductive semiconductor layer and the n-conductive semiconductor layer, the active region intended for generating radiation.

2. The semiconductor body according to claim 1, further comprising at least one further semiconductor layer, wherein the p-conductive semiconductor layer is covered by the at least one further semiconductor layer.

3. The semiconductor body according to claim 1, wherein the p-conductive semiconductor layer is arranged between the active region and a carrier or a growth substrate.

4. The semiconductor body according to claim 3, wherein the semiconductor body comprises a polarity-inverted structure with the following sequence of layers:
   the growth substrate,
   the p-conductive semiconductor layer on the growth substrate,
   the active region on the p-conductive semiconductor layer, and
   the n-conductive semiconductor layer on the active region.

5. The semiconductor body according to claim 1, wherein the further dopant is configured with regard to material and concentration in such a way in the n-conductive semiconductor layer as to increase permeability of the n-conductive semiconductor layer to hydrogen.

6. The semiconductor body according to claim 1, wherein the further dopant in the n-conductive semiconductor layer acts as an acceptor.

7. The semiconductor body according to claim 1, wherein the further dopant is identical to the p-dopant of the p-conductive semiconductor layer.

8. The semiconductor body according to claim 1, wherein the further dopant has a concentration in the n-conductive semiconductor layer between $1 \times 10^{17}$ cm$^{-3}$ inclusive and $5 \times 10^{18}$ cm$^{-3}$ inclusive.

9. The semiconductor body according claim 1, wherein the further dopant has a concentration in the n-conductive semiconductor layer of at most 50% of the concentration of the n-dopant.

10. The semiconductor body according to claim 1, wherein the semiconductor body comprises the active region and a further active region each of which is intended for generating radiation, wherein the n-conductive semiconductor layer is provided between the active region and the further active region.

11. The semiconductor body according to claim 1, wherein the semiconductor body is based on a nitride compound semiconductor material.

12. The semiconductor body according to claim 1, wherein the semiconductor body is part of luminescent diode chip.

13. The semiconductor body according to claim 1, wherein the semiconductor body is part of a laser diode chip.

14. The semiconductor body according to claim 1, wherein the semiconductor body is part of a thin film semiconductor chip.

15. A method of producing a semiconductor body, the method comprising:
   forming an n-conductive semiconductor layer, wherein the n-conductive semiconductor layer contains an n-dopant and a further dopant, wherein the further dopant has a concentration of at least $10^{16}$ cm$^{-3}$;
   forming a p-conductive semiconductor layer, wherein the p-conductive semiconductor layer contains a p-dopant; and
   forming an active region and/or a tunnel contact between the p-conductive semiconductor layer and the n-conductive semiconductor layer, the active region intended for generating radiation.

16. The method according to claim 15 of producing comprising:
   depositing a first semiconductor layer containing the p-dopant and hydrogen;
   depositing a second semiconductor layer containing the n-dopant and the further dopant; and
   activating the p-dopant of the first semiconductor layer to form the p-conductive semiconductor layer, wherein hydrogen from the first semiconductor layer passes through the n-conductive semiconductor layer.

17. The method according to claim 16, wherein activating the p-dopant comprises activating the p-dopant thermally.

18. The method according to claim 16, wherein forming the active region and/or the tunnel contact comprises depositing an active layer over the first semiconductor layer, the second semiconductor layer deposited over the active layer.

19. The method according to claim 16, wherein the presence of the further dopant promotes the hydrogen from the semiconductor layer to pass through the n-conductive semiconductor layer.

* * * * *

UNITED STATES PATENT AND TRADEMARK OFFICE
CERTIFICATE OF CORRECTION

| | |
|---|---|
| PATENT NO. | : 8,581,264 B2 |
| APPLICATION NO. | : 12/922864 |
| DATED | : November 12, 2013 |
| INVENTOR(S) | : Martin Strassburg |

Page 1 of 1

It is certified that error appears in the above-identified patent and that said Letters Patent is hereby corrected as shown below:

In the Claims:

In Col. 10, line 5, claim 9, after "according" insert --to--.
In Col. 10, line 19, claim 12, after "is part of" insert --a--.
In Col. 10, line 38, claim 16, delete "of producing".

Signed and Sealed this
Seventh Day of January, 2014

Margaret A. Focarino
*Commissioner for Patents of the United States Patent and Trademark Office*